(12) United States Patent
Oshita et al.

(10) Patent No.: US 6,456,169 B2
(45) Date of Patent: Sep. 24, 2002

(54) VOLTAGE-CONTROLLED OSCILLATOR AND ELECTRONIC DEVICE USING SAME

(76) Inventors: Teruaki Oshita, c/o Murata Manufacturing Co., Ltd., 26-10, Tenjin 2-chrome, Nagaokakyo-shi, Kyoto-fu (JP); Shinji Goma, c/o Murata Manufacturing Co., Ltd., 26-10, Tenjin 2-chrome, Nagaokakyo-shi, Kyoto-fu (JP)

( * ) Notice: Subject to any disclaimer, the term of this patent is extended or adjusted under 35 U.S.C. 154(b) by 0 days.

(21) Appl. No.: 09/746,896

(22) Filed: Dec. 22, 2000

(30) Foreign Application Priority Data

Dec. 22, 1999 (JP) .......................... 11-364756
Dec. 5, 2000 (JP) ....................... 2000-370250

(51) Int. Cl.[7] .................. H03B 5/02; H03B 5/12; H03B 5/18
(52) U.S. Cl. ................. 331/96; 331/108 D; 331/117 R; 331/117 D; 331/175; 331/177 V; 331/179
(58) Field of Search ................. 331/36 C, 44, 331/96, 108 D, 117 R, 117 FE, 117 D, 175, 177 V, 179

(56) References Cited

U.S. PATENT DOCUMENTS 3,614,665 A * 10/1971 Weller et al. ............... 331/101
4,360,867 A * 11/1982 Gonda ........................ 363/158
5,534,825 A    7/1996 Goma et al.
5,565,821 A   10/1996 Murtojarvi
5,852,388 A * 12/1998 Nakai et al. ............ 331/177 V

FOREIGN PATENT DOCUMENTS

| DE | 32 46 295 | 6/1984 |
| DE | 199 14 698 | 10/1999 |
| JP | 56-149405 | 8/1984 |
| JP | 60-062705 | 4/1985 |

* cited by examiner

*Primary Examiner*—David Mis

(57) ABSTRACT

A voltage-controlled oscillator has a frequency of oscillation that is varied using a substrate on which the same circuit pattern as that of the voltage-controlled oscillator is printed. In a resonant circuit included in the voltage-controlled oscillator, a first land is arranged substantially parallel to an inductor. A second land is arranged substantially parallel to the inductor and to a variable-capacitance diode. The capacitances of capacitors attached to the first land and second land are changed in order to vary the frequency of oscillation of the voltage-controlled oscillator. The frequency of oscillation can be varied without the necessity of scraping the inductor through which a major signal passes. Therefore, electrical characteristics of the voltage-controlled oscillator are not degraded and the frequency of oscillation is very steady. The frequency of oscillation can be varied merely by changing the capacitances of the capacitors attached to the first and second lands. Consequently, a step of scraping a strip line can be excluded, and manufacturing efficiency can be improved.

21 Claims, 5 Drawing Sheets

VOLTAGE-CONTROLLED OSCILLATOR AND ELECTRONIC DEVICE USING SAME

BACKGROUND OF THE INVENTION

1. Field of the Invention

The present invention relates to a voltage-controlled oscillator and an electronic device incorporating a voltage-controlled oscillator, or more particularly, the present invention relates to a voltage-controlled oscillator adaptable to communication devices and an electronic device incorporating the voltage-controlled oscillator.

2. Description of the Related Art

In recent years, a voltage-controlled oscillator having a frequency of oscillation that can be varied diversely has been demanded for use with various electronic devices including a portable telephone. For providing the voltage-controlled oscillator having a frequency of oscillation that can be varied diversely, a new printed-circuit board may be designed for each frequency of oscillation. However, this approach has enormous costs. According to an alternative approach, an inductive component to be included in a resonant circuit is realized with a strip line, the stripline is scraped in order to vary the inductance of the inductive component, and thus, the frequency of oscillation of a voltage-controlled oscillator is varied.

Moreover, for designing a voltage-controlled oscillator, simulation is often carried out using a computer. However, there is an error between a theoretical value determined via simulation and a measured value obtained using a prototype. A generally adopted procedure for correcting the error is to scrape a strip line included in the resonant circuit so as to change the inductance of the inductive component.

Moreover, the work for adjusting electrical characteristics such as a carrier-to-noise ratio includes scraping of the strip line included in the resonant circuit.

FIG. 6 shows a conventional voltage-controlled oscillator. Referring to FIG. 6, a voltage-controlled oscillator 3 consists mainly of a resonant circuit 31 and an amplification circuit 12. The resonant circuit 31 has one terminal of an inductor L1, which is a strip line, connected to the amplification circuit 12 via a capacitor C2. The other terminal of the inductor L1 is connected to the cathode of a variable-capacitance diode VD1. The cathode of the variable-capacitance diode VD1 is connected to a control voltage terminal a2 via an inductor L3 that is a choke coil. The anode of the variable-capacitance diode VD1 is grounded. The capacitor C2 is a coupling capacitor.

The resonant circuit 31 is connected to the base of a transistor Tr1 which functions as an amplification element in the amplification circuit 12. The emitter of the transistor Tr1 is connected to an output terminal a3 via a capacitor C7. The collector of the transistor Tr1 is grounded via a capacitor C4. A power terminal a4 is grounded via a capacitor C5, and connected to the collector of the transistor Tr1 via an inductor L4 that is a choke coil. The base and emitter of the transistor Tr1 are biased by resistors R1, R2, and R3. A capacitor C3 is connected between the base and emitter of the transistor Tr1.

In the thus-configured voltage-controlled oscillator 3, the inductance of the inductor L1 is adjusted in order to vary the frequency of oscillation of the voltage-controlled oscillator or improve the electrical characteristics thereof such as a carrier-to-noise ratio. The inductor L1 is a circuit element enabling variation of the frequency of oscillation and greatly contributing to the electric characteristic such as the carrier-to-noise ratio.

Moreover, in the thus-configured voltage-controlled oscillator 3, the variable-capacitance diode VD1 and inductor L1 are connected in series with each other to thus realize a series resonant circuit suitable for expanding a frequency band within which the frequency of oscillation can be varied. The series resonant circuit has a property that when the frequency band within which the frequency of oscillation is variable is larger than 10% of the frequency of oscillation, a loss caused by the resonant circuit 31 hardly depends on the frequency of oscillation.

In the voltage-controlled oscillator 3, the inductor L1 included in the resonant circuit 31 having the series resonant circuit and realized with a strip line is scraped using a laser in order to vary the frequency of oscillation of the voltage-controlled oscillator and to improve the electrical characteristics thereof such as a carrier-to-noise ratio.

However, since a major signal passes through the inductor L1, when the inductor L1 must be adjusted, quite delicate and very accurate adjustment is required. This poses a problem in that manufacturing efficiency is degraded. Moreover, since the major signal passes through the inductor L1, when the inductor L1 is adjusted, the electrical characteristics of the voltage-controlled oscillator 3 is likely to be degraded or the frequency of oscillation thereof is likely to be unstable. Moreover, the step of scraping the inductor L1 is needed for every product. This degrades the manufacturing efficiency. These problems become more serious when the frequency band within which the frequency of oscillation is variable is wider.

SUMMARY OF THE INVENTION

In order to overcome the problems described above, preferred embodiments of the present invention provide a voltage-controlled oscillator having a frequency of oscillation that is readily varied and an electrical characteristic thereof such as a carrier-to-noise ratio readily improved even when a frequency band within which the frequency of oscillation is variable is wide.

Other preferred embodiments of the present invention provide a voltage-controlled oscillator having a frequency of oscillation can be varied greatly without the necessity of scraping a strip line.

Further preferred embodiments of the present invention provide a voltage-controlled oscillator having an electric characteristic thereof that is not degraded and a frequency of oscillation thereof that is stable even when a strip line is scraped in order to adjust part of a resonant circuit for the purpose of varying the frequency of oscillation or improving the electrical characteristics thereof such as a carrier-to-noise ratio.

According to one preferred embodiment of the present invention, a voltage-controlled oscillator includes a resonant circuit and an amplification circuit. The resonant circuit includes an inductor having one terminal that is connected to the amplification circuit and another terminal that is grounded via a variable-capacitance diode, and a land to which a capacitor can be mounted. The first land has one terminal thereof connected to one terminal of the inductor and the other terminal thereof connected to the other terminal of the inductor.

Moreover, according to other preferred embodiments of the present invention, a voltage-controlled oscillator includes a resonant circuit and an amplification circuit. The resonant circuit includes an inductor having one terminal that is connected to the amplification circuit and another terminal that is grounded via a variable-capacitance diode, and a land to which a capacitor can be mounted. The land has one terminal thereof connected to one terminal of the inductor and the other terminal thereof grounded.

Moreover, according to other preferred embodiments of the present invention, a voltage-controlled oscillator includes a resonant circuit and an amplification circuit. The resonant circuit includes an inductor having one terminal that is connected to the amplification circuit and another terminal that is grounded via a variable-capacitance diode, and first and second lands to which a capacitor can be mounted. The first land has one terminal thereof connected to one terminal of the inductor and the other terminal thereof connected to the other terminal of the inductor. The second land has one terminal thereof connected to one terminal of the inductor and the other terminal thereof grounded.

Moreover, according to other preferred embodiments of the present invention, a voltage-controlled oscillator has a transmission line element interposed between the land and a ground terminal.

Moreover, according to other preferred embodiments of the present invention, a voltage-controlled oscillator has a transmission line element interposed between the variable-capacitance diode and a ground.

Moreover, according to other preferred embodiments of the present invention, in a voltage-controlled oscillator, the transmission line element has an adjustment terminal to change an impedance of the transmission line element by disconnecting from the ground terminal.

Moreover, according to other preferred embodiments of the present invention, an electronic device includes the voltage-controlled oscillators according to other preferred embodiments of the present invention.

As a result of the unique features of preferred embodiments of the present invention, a voltage-controlled oscillator in accordance with preferred embodiments of the present invention has its frequency of oscillation varied without the necessity of scraping an inductor through which a major signal passes. Therefore, the electrical characteristics of the voltage-controlled oscillator will hardly be deteriorated and the frequency of oscillation thereof will hardly be unstable.

Moreover, in a voltage-controlled oscillator in accordance with preferred embodiments of the present invention it is not necessary to scrape an inductor through which a major signal passes for the purpose of varying the frequency of oscillation thereof or improving a carrier-to-noise ratio thereof. Therefore, a chip coil exhibiting a high Q factor may be adopted as the inductor. In this case, the electrical characteristics of the voltage-controlled oscillator such as the carrier-to-noise ratio can be improved.

Moreover, the frequency of oscillation of a voltage-controlled oscillator in accordance with preferred embodiments of the present invention can be varied greatly by changing the capacitances of discrete capacitors mounted to the first and second lands. It is not necessary to scrape a strip line. Otherwise it is possible to reduce an amount by which the strip line is scraped. Consequently, manufacturing efficiency improves.

Moreover, a magnitude by which the frequency of oscillation of a voltage-controlled oscillator in accordance with preferred embodiments of the present invention or the electrical characteristics thereof such as a carrier-to-noise ratio can be adjusted varies depending on what portion of a transmission line element is cut. By selecting a proper portion of the transmission line, the frequency of oscillation or the electrical characteristics such as a carrier-to-noise ratio can be adjusted properly.

Moreover, a resonant circuit of a voltage-controlled oscillator in accordance with other preferred embodiments of the present invention includes first and second lands and a transmission line element defining circuit elements used to adjust the frequency of oscillation of the voltage-controlled oscillator or the electrical characteristics thereof such as a carrier-to-noise ratio. The first and second lands enable adjustment by a large magnitude. The line element enables adjustment by a small magnitude. These increase the freedom of design. Consequently, the frequency of oscillation or the electrical characteristics such as a carrier-to-noise ratio can be adjusted readily.

Moreover, a communication device in accordance with a preferred embodiment of the present invention incorporates a voltage-controlled oscillator in accordance with other preferred embodiments of the present invention that prevents degradation of electrical characteristics and has a very reliable frequency of oscillation. The communication device is therefore regarded as an electronic device achieving excellent output characteristics.

Other features, elements, characteristics and advantages of the present invention will become apparent from the detailed description of preferred embodiments thereof with reference to the attached drawings.

DETAILED DESCRIPTION OF THE PREFERRED EMBODIMENTS

Figure 1:
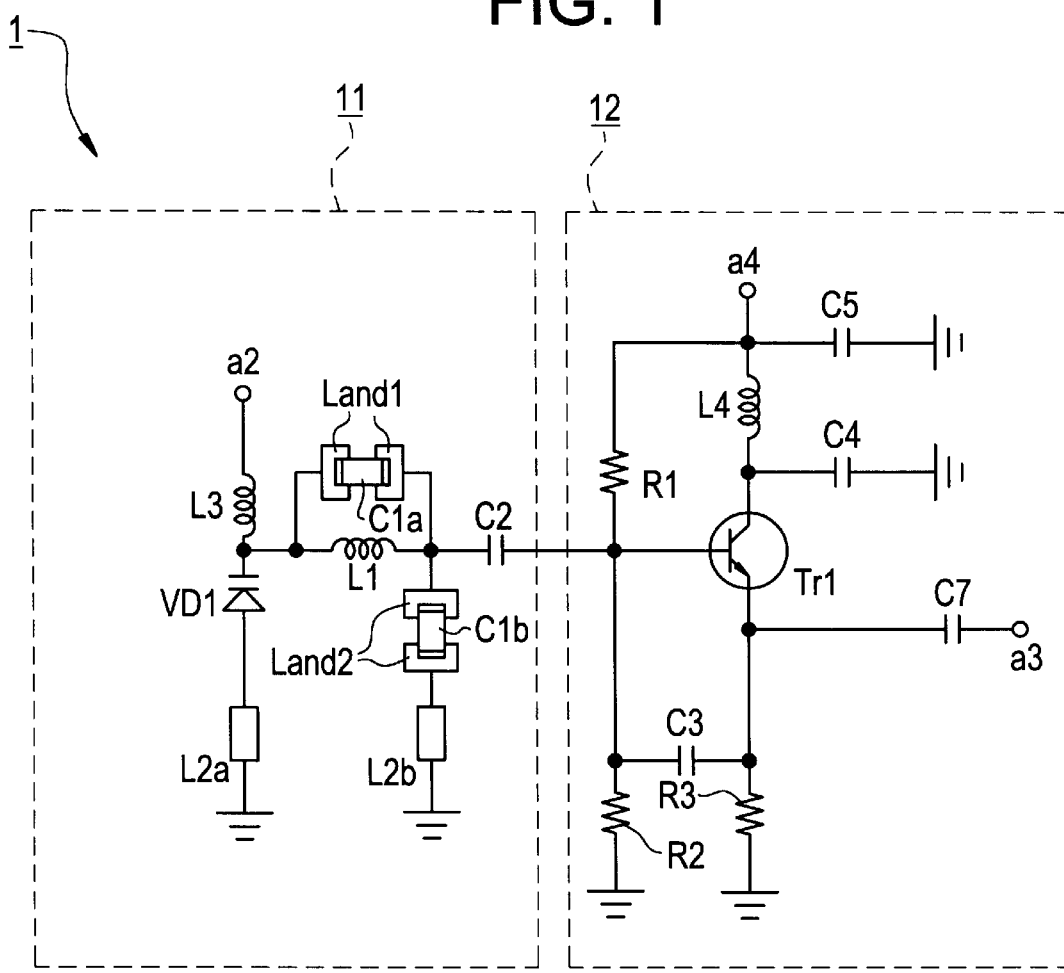
FIG. 1 is a circuit diagram showing a preferred embodiment of a voltage-controlled oscillator in accordance with the present invention.
Figure 6:
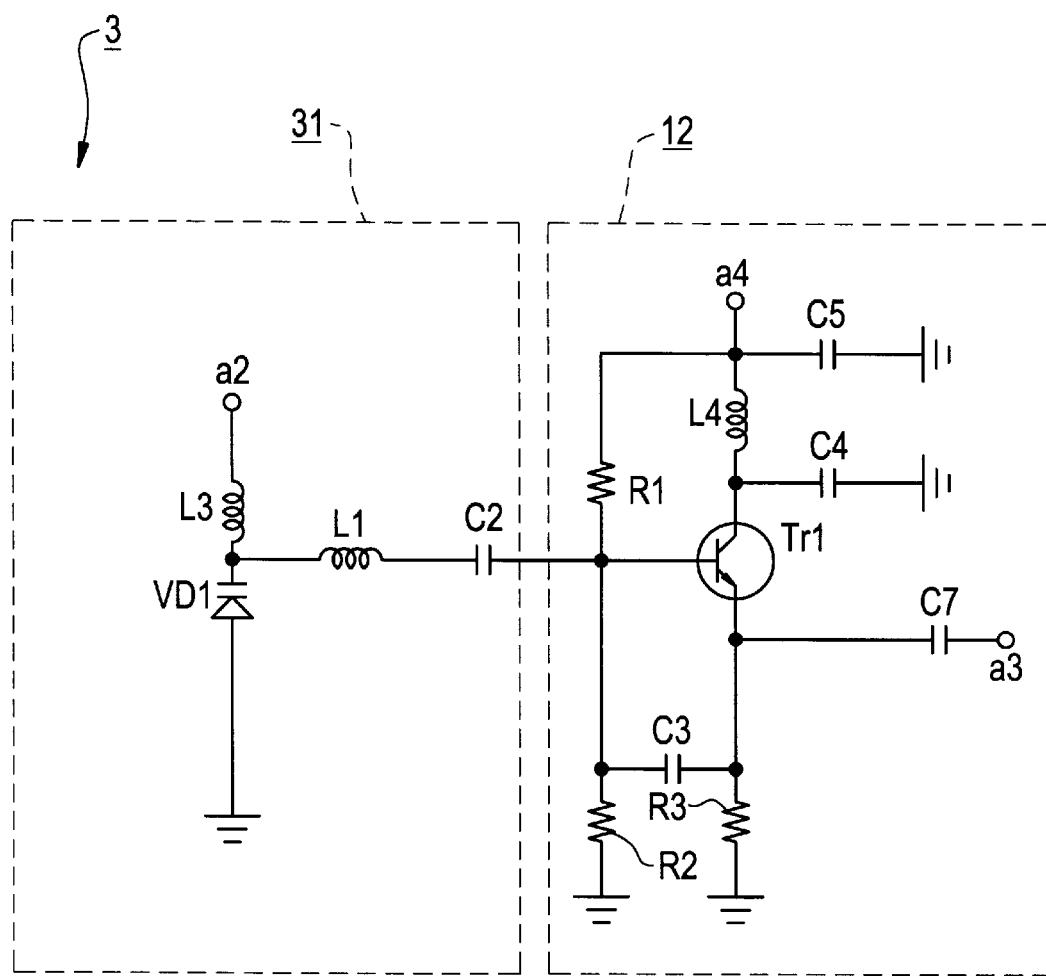
FIG. 6 is a circuit diagram showing a conventional voltage-controlled oscillator.

FIG. 1 shows a preferred embodiment of a voltage-controlled oscillator in accordance with the present invention. In FIG. 1, the same reference numerals are assigned to components identical or equivalent to those shown in FIG. 6. The description of these similar components will be omitted.

Referring to FIG. 1, a resonant circuit 11 included in a voltage-controlled oscillator 1 has, in addition to the same components as the resonant circuit 31, a first land Land1, a second land Land2, a capacitor C1a, a capacitor C1b, and inductors L2a and L2b that are transmission line elements. The first land Land1 and second land Land2 are pairs of electrode patterns to which chip components are mounted. The capacitor C1a is mounted to the first land Land1, and the capacitor C1b is mounted to the second land Land2. One terminal of the inductor L1 is connected to one terminal of the first land Land1 and one terminal of the second land Land2, and also connected to an amplification circuit 12 via the capacitor C2. The other terminal of the inductor L1 is connected to the cathode of the variable-capacitance diode VD1 and to the other terminal of the first land Land1, and also connected to the control voltage terminal a2 via the inductor L3. The anode of the variable-capacitance diode VD1 is grounded via the inductor L2b. The other terminal of the second land Land2 is grounded via the inductor L2b. The inductors L2a and L2b are preferably defined by strip lines, and the capacitors C1a and C1b are preferably defined by chip capacitors.

Figure 2A:
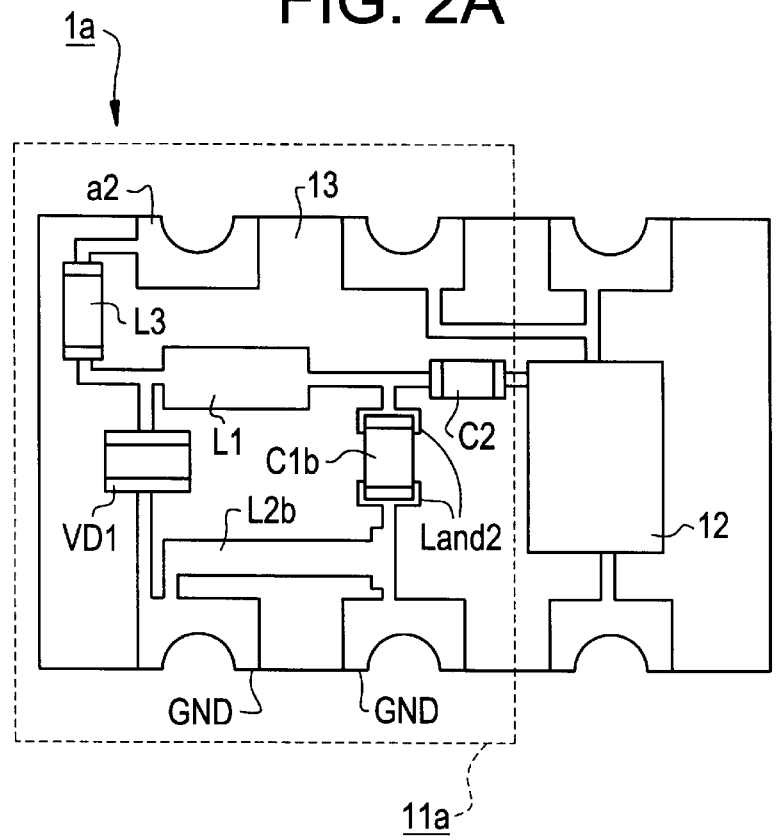
FIG. 2A and FIG. 2B are plan views of another preferred embodiment of the voltage-controlled oscillator in accordance with the present invention.
Figure 2B:
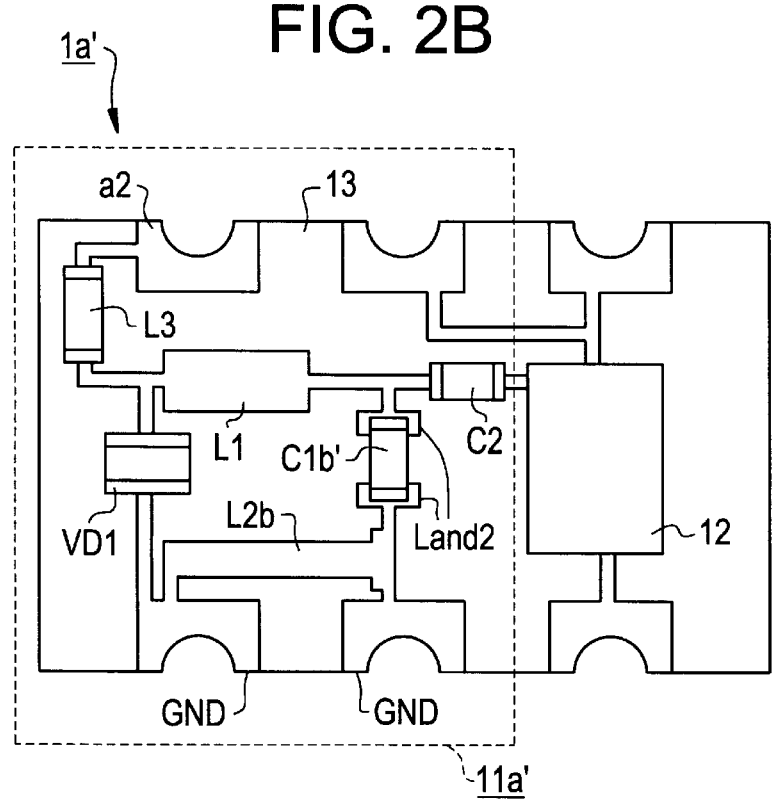

Referring to FIG. 2A and FIG. 2B, a method of switching a voltage-controlled oscillator 1a of which oscillation frequency is 1.8 GHz, into a voltage-controlled oscillator 1a' of which oscillation frequency is 3 GHz will be described in accordance with various preferred embodiments of the present invention. FIG. 2A is a plan view of the voltage-controlled oscillator 1a having a frequency of oscillation that is 1.8 GHz, and FIG. 2B is a plan view of the voltage-controlled oscillator 1a' having a frequency of oscillation that is 3 GHz. In FIG. 2A and FIG. 2B, the same reference numerals are assigned to identical or equivalent components. The description of the components will be not repeated.

The voltage-controlled oscillators 1a and 1a' shown in FIG. 2A and FIG. 2B include resonant circuits 11a and 11a' respectively that do not include the first land Land1, capacitor C1a, and inductor L2a included in the resonant circuit 11 shown in FIG. 1. Circuit wirings, the second land Land2, and the inductors L1 and L2b that are strip lines are printed on a substrate 13 of each of the voltage-controlled oscillators 1a and 1a'. The capacitors C1b or C1b' and C2, variable-capacitance diode VD1, inductor L3, and amplification circuit 12 are mounted on the substrate 13.

The first and second steps described below are followed orderly, whereby the voltage-controlled oscillator 1a having a frequency of oscillation that is 1.8 GHz can be switched to the voltage-controlled oscillator 1a' having a frequency of oscillation that is 3 GHz.

To begin with, the first step is a step of removing the capacitor C1b from the second land Land2. At this time, since the capacitor C1b is constituted of a chip capacitor, the capacitor C1b can be removed readily. If the frequency of oscillation of the voltage-controlled oscillator 1a becomes 3 GHz when the capacitor C1b is removed, the step described below need not be performed.

The second step is a step of mounting the capacitor C1b', of which capacitance is different from that of the capacitor C1b, to the second land Land2. The capacitances of the capacitors C1b and Cb1' may be determined so that once the capacitor C1b is replaced with the capacitor C1b', the frequency of oscillation of the voltage-controlled oscillator 1a is changed from 1.8 GHz to 3 GHz. This would greatly improve manufacturing efficiency.

In the voltage-controlled oscillator 1a, capacitance of the capacitor C1b as well as the inductor L1 greatly contributes to switching of the oscillation frequency. When the capacitance of the capacitor C1b is changed to a proper capacitance with the property of the inductor L1 remaining original, the frequency of oscillation can be changed.

In other words, in preferred embodiments of the present invention, as apparent from the comparison of the voltage-controlled oscillator 1a with the voltage-controlled oscillator 1a', the frequency of oscillation of a voltage-controlled oscillator can be varied diversely by simply mounting a chip capacitor having a proper capacitance to the second land Land2 on the same substrate on which a circuit pattern is printed.

The method of changing the frequency of oscillation of the voltage-controlled oscillator 1a from one frequency to another has been described. The advantages of preferred embodiments of the present invention are not related to varying the frequency of oscillation. The advantages of preferred embodiments of the present invention relate to the frequency of oscillation of a voltage-controlled oscillator being varied diversely depending on whether or not the capacitors C1a and C1b are mounted to the first land Land1 and second land Land2 or whatever capacitance a capacitor mounted has.

As shown in FIG. 2A and FIG. 2B, each of the voltage-controlled oscillators 1a and 1a' includes the inductor L2b that is a strip line. A major signal does not pass through the inductor L2b. Further, the inductor L2b has a relatively negligible affect on the frequency of oscillation of the voltage-controlled oscillator or the electrical characteristics thereof such as a carrier-to-noise ratio. After changing the oscillation frequency, if necessary, the oscillation frequency or the electrical characteristics such as a carrier-to-noise ratio can be adjusted finely by scraping the inductor L2b using a laser or other suitable means in the voltage-controlled oscillator 1a and the voltage-controlled oscillator 1a'.

Figure 3:
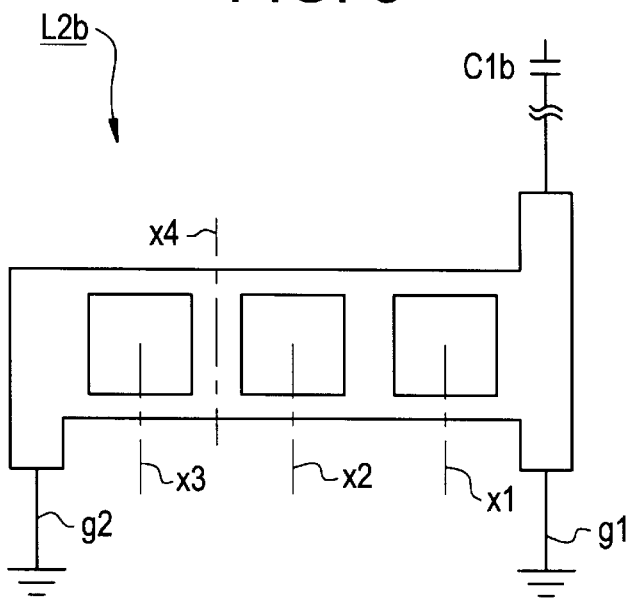
FIG. 3 is an enlarged view of a line element included in the voltage-controlled oscillator shown in FIG. 2.

FIG. 3 is an enlarged view of the inductor L2b. A method of finely adjusting the voltage-controlled oscillator 1a' will be described below. Assume that the frequency of oscillation of the voltage-controlled oscillator 1a' including the inductor L2b shown in FIG. 3 is 3 GHz. In this case, if the inductor L2b is cut along near a dot-dash line x1, the frequency of oscillation is lowered by approximately 80 MHz. If the inductor L2b is cut along near a dot-dash line x2, the frequency of oscillation is lowered by approximately 20 MHz. If the inductor L2b is cut along near a dot-dash line x3, the frequency of oscillation is lowered by approximately 2 MHz. Thus, the frequency of oscillation can be varied by a desired value depending what portion of the inductor L2b is cut.

Moreover, the inductor L2b shown in FIG. 3 has an adjustment terminal g1 and an adjustment terminal g2 that are grounded. An impedance of the inductor L2b may be adjusted by disconnecting one of the adjustment terminals g1 and g2 from a ground. The inductor L2b shown in FIG. 3 may be cut along a dot-dash line x4 in order to adjust the frequency of oscillation.

Compared with a case in which the inductor L2b is cut along the dot-dash line x1, x2, or x3, when the inductor L2b is cut along the dot-dash line x4 or the adjustment terminal g1 or g2 is disconnected, the frequency of oscillation or the electrical characteristics such as a carrier-to-noise ratio can be varied within a large range. Moreover, these portions of the inductor to be cut may be combined, whereby freedom in designing is further increased. Consequently, a pattern space may not be widened but adjustment of the frequency of oscillation and improvement of the electrical characteristics such as the carrier-to-noise ratio can be achieved easily.

Using the voltage-controlled oscillators 1a and 1a' shown in FIG. 2A and FIG. 2B, it has been described that the frequency of oscillation of the voltage-controlled oscillator 1a is varied by replacing the capacitor C1b attached to the second land Land2 with the capacitor C1b'. Even the frequency of oscillation of the voltage-controlled oscillator 1 shown in FIG. 1 can be varied by replacing the capacitors C1a and C1b attached to the first land Land1 and second land Land2 with others in the same manner as that mentioned above or by breaking the inductors L2a and L2b in the same manner as that mentioned above.

Figure 4A:
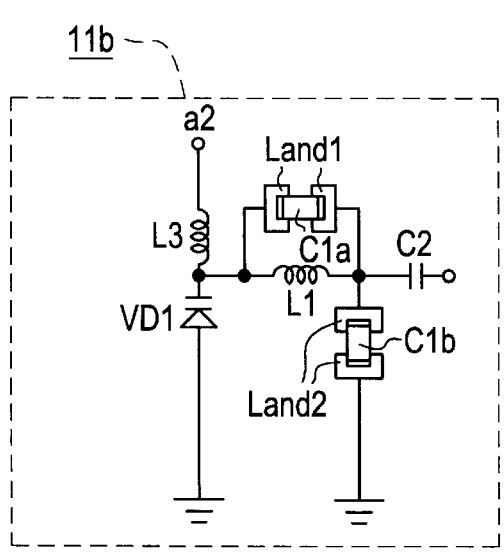
FIG. 4A and FIG. 4B are circuit diagrams showing a resonant circuit included in still another preferred embodiment of the voltage-controlled oscillator in accordance with the present invention.
Figure 4B:
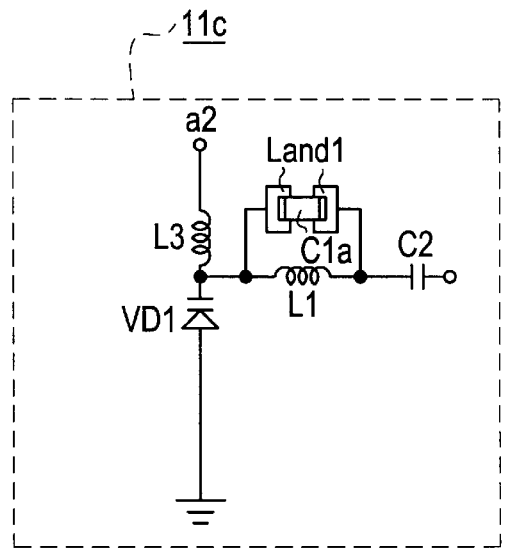

FIG. 4A and FIG. 4B show a resonant circuit included in still another preferred embodiment of the voltage-controlled oscillator in accordance with the present invention. In FIG. 4A and FIG. 4B, the same reference numerals are assigned to components identical to those shown in FIG. 1. The description of the components will be omitted.

Referring to FIG. 4A, a resonant circuit 11b preferably has the same circuit elements as the resonant circuit 11 shown in FIG. 1 but does not include the inductor L2a and inductor L2b.

The resonant circuit 11b does not include the inductor L2a and inductor L2b that are strip lines. The capacitors C1a and C1b attached to the first land Land1 and second land Land2 are replaced with others, whereby the frequency of oscillation of the voltage-controlled oscillator can be altered. Even when one of the inductors L2a and L2b is removed, the same operations and advantages will be obtained.

Referring to FIG. 4B, a resonant circuit 11c has a configuration excluding the second land Land2 and capacitor C1b shown in FIG. 4A. Thus, even when the first land Land1 and capacitor C1a alone are provided, the frequency of oscillation of the voltage-controlled oscillator can be varied. FIG. 4B may have the same circuit elements as removing the second land Land2 and capacitor C1b or only the capacitor C1b from the resonant circuit 11b shown in FIG. 4A. Even when the capacitor C1a instead of the capacitor C1b is removed from the resonant circuit 11b shown in FIG. 4A, the same operations and advantages with the resonant circuit shown in FIG. 4B are obtained.

The voltage-controlled oscillator in accordance with preferred embodiments of the present invention is not limited to the circuit elements incorporated in the above-described preferred embodiment to constitute a resonant circuit, amplification circuit, and a transmission line element. Alternatively, a microstrip line may be adopted as an inductor or a transmission line element.

Figure 5:
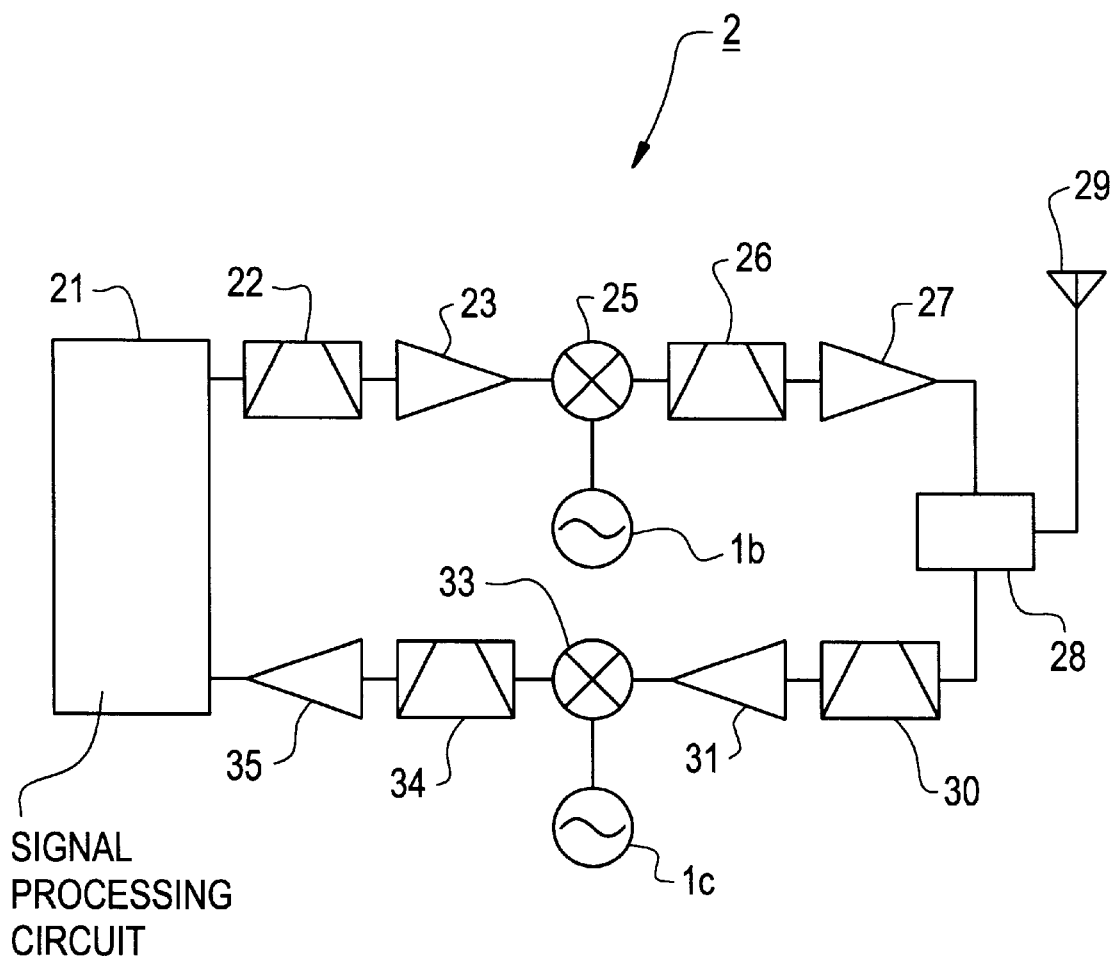
FIG. 5 is a block diagram showing a preferred embodiment of an electronic device in accordance with the present invention.

FIG. 5 is a block diagram showing a communication device that is another preferred embodiment of an electronic device in accordance with the present invention. Referring to FIG. 5, a communication device 2 includes a signal processing circuit 21, bandpass filters 22, 26, 30, and 34, amplifiers 23, 27, 31, and 35, mixers 25 and 33, a duplexer 28, an antenna 29, and voltage-controlled oscillators 1b and 1c. Herein, an output terminal of the signal processing circuit 21 is connected to the mixer 25 via the bandpass filter 22 and amplifier 23 that are connected in series with each other. An output terminal of the voltage-controlled oscillator 1b is connected to the mixer 25. An output terminal of the mixer 25 is connected to the duplexer 28 connected to the antenna 29 via the bandpass filter 26 and amplifier 27 that are connected in series with each other. The duplexer 28 is connected to the mixer 33 via the bandpass filter 30 and amplifier 31 that are connected in series with each other. An output terminal of the voltage-controlled oscillator 1c is connected to the mixer 33. An output terminal of the mixer 33 is connected to the signal processing circuit 21 via the bandpass filter 34 and amplifier 35 that are connected in series with each other.

In the communication device 2, for signal transmission, an output signal of the signal processing circuit 21 has its unnecessary components removed by the bandpass filter 22. The resultant signal is amplified by the amplifier 23, and mixed with a signal output from the voltage-controlled oscillator 1b by the mixer 25. The signal is thus frequency-converted into a radio-frequency signal. The radio-frequency signal has its unnecessary components removed by the bandpass filter 26. The resultant signal is amplified by the amplifier 27, and radiated through the antenna 29 via the duplexer 28. For signal reception, a radio-frequency signal received through the antenna 29 is input to the bandpass filter 30 via the duplexer 28. The radio-frequency signal has its unnecessary components removed by the bandpass filter 30. The resultant signal is amplified by the amplifier 31, and mixed with a signal output from the voltage-controlled oscillator 1c by the mixer 33. The signal is thus frequency-converted into an intermediate-frequency signal. The intermediate-frequency signal has its unnecessary components removed by the bandpass filter 34. The resultant signal is amplified by the amplifier 35 and input to the signal processing circuit 21. Transmission and reception of a signal are thus carried out.

The thus-configured communication device 2 is realized as an electronic device achieving an excellent output capability owing to the inclusion of the voltage-controlled oscillators 1b and 1c each of which has electrical characteristics that are not degraded and a very steady frequency of oscillation.

The communication device 2 has been used as an example in order to describe an electronic device including a voltage-controlled oscillator in accordance with a preferred embodiment of the present invention. The electronic device in accordance with preferred embodiments of the present invention is not limited to the communication device having the above-described configuration.

According to preferred embodiments of the present invention, the frequency of oscillation of a voltage-controlled oscillator can be varied without the necessity of scraping an inductor through which a major signal passes. Therefore, electrical characteristics of the voltage-controlled oscillator are not degraded and the frequency of oscillation thereof is very steady.

According to preferred embodiments of the present invention, it is unnecessary to scrape an inductor, through which a major signal passes, for the purpose of varying the frequency of oscillation of a voltage-controlled oscillator or improving a carrier-to-noise ratio thereof. A chip coil exhibiting a high Q factor can be adopted as the inductor. In this case, the electrical characteristics such as the carrier-to-noise ratio can be improved.

Moreover, according to preferred embodiments of the present invention, the frequency of oscillation of a voltage-controlled oscillator can be varied greatly by changing the capacitances of capacitors attached to first and second lands. This obviates the necessity of scraping a strip line. Otherwise, the magnitude of scraping can be reduced. Consequently, manufacturing efficiency is greatly improved.

Moreover, according to preferred embodiments of the present invention, a magnitude of adjustment of the frequency of oscillation of a voltage-controlled oscillator or electrical characteristics such as a carrier-to-noise ratio thereof varies depending on what portion of a line element is cut. Consequently, the frequency of oscillation and the electrical characteristics such as the carrier-to-noise ratio can be adjusted readily by selecting a proper portion of the line element.

Moreover, according to preferred embodiments of the present invention, a resonant circuit included in a voltage-controlled oscillator includes first and second lands and a line element as circuit elements used to adjust the frequency of oscillation of the voltage-controlled oscillator or an electric characteristic thereof such as a carrier-to-noise ratio. The first and second lands enable adjustment by a large magnitude, while the line element enables adjustment by a minute magnitude. Consequently, freedom in designing expands, and the frequency of oscillation or the electrical characteristics such as the carrier-to-noise ratio can be adjusted readily.

Moreover, according to preferred embodiments of the present invention, a communication device includes a voltage-controlled oscillator in accordance with other preferred embodiments of the present invention that has electrical characteristics that are not degraded and a frequency of oscillation that is very steady. The communication device is therefore provided as an electric device achieving an excellent output capability.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A voltage-controlled oscillator comprising:

a resonant circuit; and an amplification circuit;

wherein said resonant circuit includes an inductor having a first terminal thereof connected to said amplification circuit and a second terminal that is grounded via a variable-capacitance diode, and a land to which a capacitor is mounted; and said land has a first terminal connected to one of the first and second terminals of said inductor and a second terminal connected to the other of the first and second terminals of said inductor.

2. The voltage controlled oscillator according to claim 1, further comprising a plurality of inductors defined by strip lines and a plurality of capacitors defined by chip capacitors.

3. The voltage controlled oscillator according to claim 1, wherein the inductor includes at least one adjustment terminal.

4. A voltage-controlled oscillator according to claim 1, wherein a transmission line element is interposed between said variable-capacitance diode and a ground.

5. A voltage-controlled oscillator according to claim 4, wherein said transmission line element has an adjustment terminal arranged to change an impedance thereof by disconnecting from the ground.

6. A electronic device comprising at least one voltage-controlled oscillator according to claim 1.

7. The voltage controlled oscillator comprising:

a resonant circuit; and an amplification circuit;

wherein said resonant circuit includes an inductor having a first terminal connected to said amplification circuit and a second terminal that is grounded via a variable-capacitance diode, and a land to which a capacitor can be mounted; and said land has a first terminal connected to one of the first and second terminals of said inductor and a second terminal that is grounded.

8. The voltage controlled oscillator according to claim 7, further comprising a plurality of inductors defined by strip lines and a plurality of capacitors defined by chip capacitors.

9. The voltage-controlled oscillator according to claim 7, wherein the inductor includes at least one adjustment terminal.

10. A voltage-controlled oscillator according to claim 7, wherein said transmission line element is interposed between said variable-capacitance diode and a ground.

11. A voltage-controlled oscillator according to claim 7, wherein said transmission line element has an adjustment terminal arranged to change an impedance thereof by disconnecting from the ground.

12. A voltage-controlled oscillator according to claim 7, wherein a transmission line element is interposed between said land and a ground.

13. An electronic device comprising at least one voltage-controlled oscillator according to claim 7.

14. A voltage-controlled oscillator comprising:

a resonant circuit; and an amplification circuit;

wherein said resonant circuit includes an inductor having a first terminal connected to said amplification circuit and a second terminal grounded via a variable-capacitance diode, and first and second lands to which a capacitor can be mounted; and said first land has a first terminal thereof connected to one of the first and second terminals of said inductor and a second terminal connected to the other of the first and second terminals of said inductor, and said second land has a first terminal thereof connected to one of the first and second terminals of said inductor and a second terminal that is grounded.

15. The voltage controlled oscillator according to claim 14, further comprising a plurality of inductors defined by strip lines and a plurality of capacitors defined by chip capacitors.

16. The voltage controlled socillator according to claim 14, wherein the inductor includes at least one adjustment terminal.

17. A voltage-controlled oscillator according to claim 14, wherein a transmission line element is interposed between said second land and a ground.

18. A voltage-controlled oscillator according to claim 14, wherein a transmission line element is interposed between said variable-capacitance diode and a ground.

19. A voltage-controlled oscillator according to claim 14, wherein said transmission line element has an adjustment terminal arranged to change an impedance thereof by disconnecting from the ground.

20. A voltage-controlled oscillator according to claim 14, wherein said transmission line element has an adjustment terminal arranged to change an impedance thereof by disconnecting from the ground.

21. An electronic device comprising at least one voltage-controlled oscillator according to claim 14.

* * * * *

UNITED STATES PATENT AND TRADEMARK OFFICE
CERTIFICATE OF CORRECTION

PATENT NO.    : 6,456,169 B2
DATED         : September 24, 2002
INVENTOR(S)   : Teruaki Oshita and Shinji Goma It is certified that error appears in the above-identified patent and that said Letters Patent is hereby corrected as shown below:

<u>Title page,</u>
Insert Item -- [73] Assignee:  Murata Manufacturing Co., Ltd. --

Signed and Sealed this

Third Day of June, 2003

JAMES E. ROGAN
*Director of the United States Patent and Trademark Office*